United States Patent
Wang et al.

(10) Patent No.: US 10,720,892 B1
(45) Date of Patent: Jul. 21, 2020

(54) ACTIVE WILKINSON COMBINER

(71) Applicant: Apple Inc., Cupertino, CA (US)

(72) Inventors: Hongrui Wang, San Diego, CA (US); Sohrab Emami-Neyestanak, San Francisco, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/248,730

(22) Filed: Jan. 15, 2019

(51) Int. Cl.
*H03F 3/45* (2006.01)
*H03F 1/56* (2006.01)
*H03F 3/193* (2006.01)
*H04B 1/16* (2006.01)
*H04B 5/00* (2006.01)

(52) U.S. Cl.
CPC .............. *H03F 1/565* (2013.01); *H03F 3/193* (2013.01); *H04B 1/16* (2013.01); *H03F 2200/222* (2013.01); *H03F 2200/451* (2013.01); *H04B 5/0075* (2013.01)

(58) Field of Classification Search
CPC ........................................................ H03F 3/45
USPC .................................................. 330/165, 276
See application file for complete search history.

(56) References Cited

U.S. PATENT DOCUMENTS

| | | | | |
|---|---|---|---|---|
| 2,815,447 A | * | 12/1957 | Dunham | H03K 3/16 331/112 |
| 2,951,991 A | * | 9/1960 | Rickner | G05D 3/1445 330/282 |
| 5,325,315 A | * | 6/1994 | Engel | H01H 47/325 702/105 |
| 8,130,057 B2 | | 3/2012 | Jones et al. | |
| 2018/0123213 A1 | * | 5/2018 | Grede | H01P 5/16 |

OTHER PUBLICATIONS

Ui-Gyu Choi, et al., "A 6.78-MHz 100-W Class E Power Amplifier Module with an Adaptive Power Combiner," 2018 IEEE International Symposium on Radio-Frequency Integration Technology (RFIT), 3 pages.

* cited by examiner

*Primary Examiner* — Henry Choe
(74) *Attorney, Agent, or Firm* — Kowert, Hood, Munyon, Rankin & Goetzel, P.C.; Erik A. Heter

(57) ABSTRACT

A Wilkinson Combiner circuit is disclosed. The circuit includes first and second input ports, and a resistive-capacitive (RC) network coupled there between. The circuit further includes an amplifier having an amplifier input node, and a coupled inductor. The coupled inductor includes first, second, and third terminals, coupled to the first input port, the second input port, and the amplifier input node, respectively. Signals conveyed from the first and second input ports are passed through the corresponding portions of the coupled inductor, are combined into a composite signal and amplified by the amplifier.

20 Claims, 9 Drawing Sheets

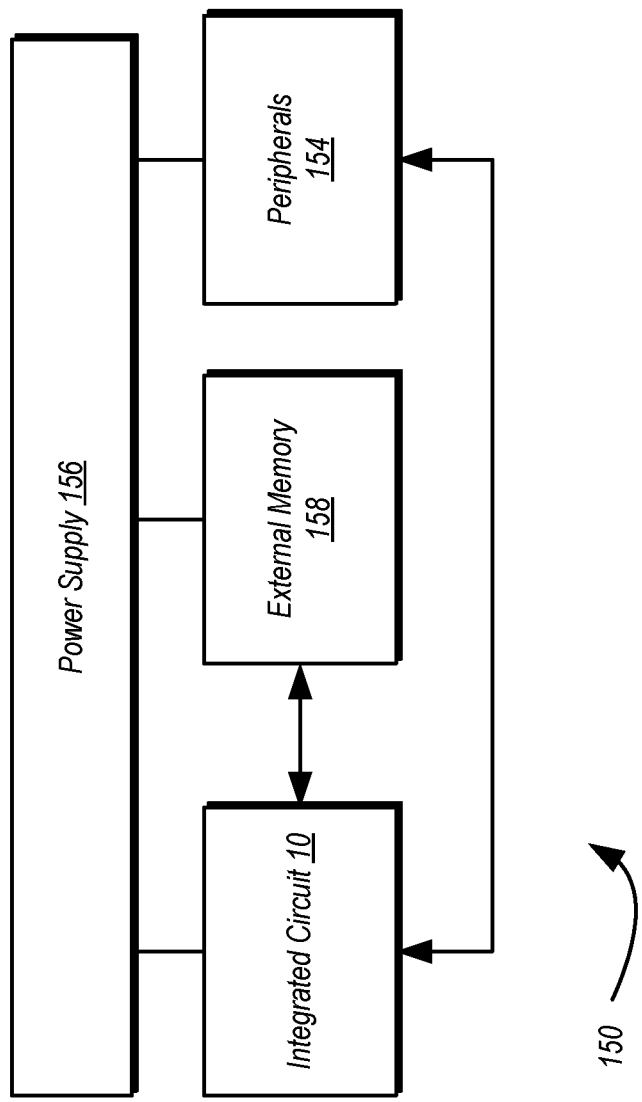

ACTIVE WILKINSON COMBINER

BACKGROUND

Technical Field

This disclosure is directed to electronic circuits, and more particularly, to combiner circuits used in wireless systems.

Description of the Related Art

Wilkinson combiners are a type of power combining/dividing circuit implemented the field of microwave and millimeter wave engineering and circuit design. A Wilkinson combiner may be used in receiver and transmitter systems. In a receiver system, power from multiple ports of a Wilkinson combiner may be combined on a common node. In a transmitter system, power on a common node may be divided and distributed to multiple output ports.

Some Wilkinson combiners are implemented using passive devices. A passive Wilkinson combiner may achieve good isolation between the combining ports while also matching all of the ports to a desired impedance. Active Wilkinson combiners may also be implemented, with multiple input ports joined at an amplifier input (e.g., via capacitors). The implementation of an active Wilkinson combiner may be simple and compact.

SUMMARY

A Wilkinson Combiner circuit is disclosed. In one embodiment, the circuit includes first and second input ports, and a resistive-capacitive (RC) network coupled therebetween. The circuit further includes an amplifier having an amplifier input node, and a coupled inductor. The coupled inductor includes first, second, and third terminals, coupled to the first input port, the second input port, and the amplifier input node, respectively. Signals conveyed from the first and second input ports are passed through the corresponding portions of the coupled inductor, are combined into a composite signal and amplified by the amplifier.

In various embodiments, the RC network coupled between the first and second input ports provides electrical isolation between the two. One embodiment of the RC network includes a resistor and a capacitor implemented in parallel between the ports.

The coupled inductor used in various embodiments includes first and second portions, the first portion being coupled between the amplifier input and the first input port, while the second portion is coupled between the amplifier input and the second input port. When operating, the first and second portions have a mutual inductance.

BRIEF DESCRIPTION OF THE DRAWINGS

The following detailed description makes reference to the accompanying drawings, which are now briefly described.

FIG. 9 is a block diagram of one embodiment of an example system.

Figure 1:
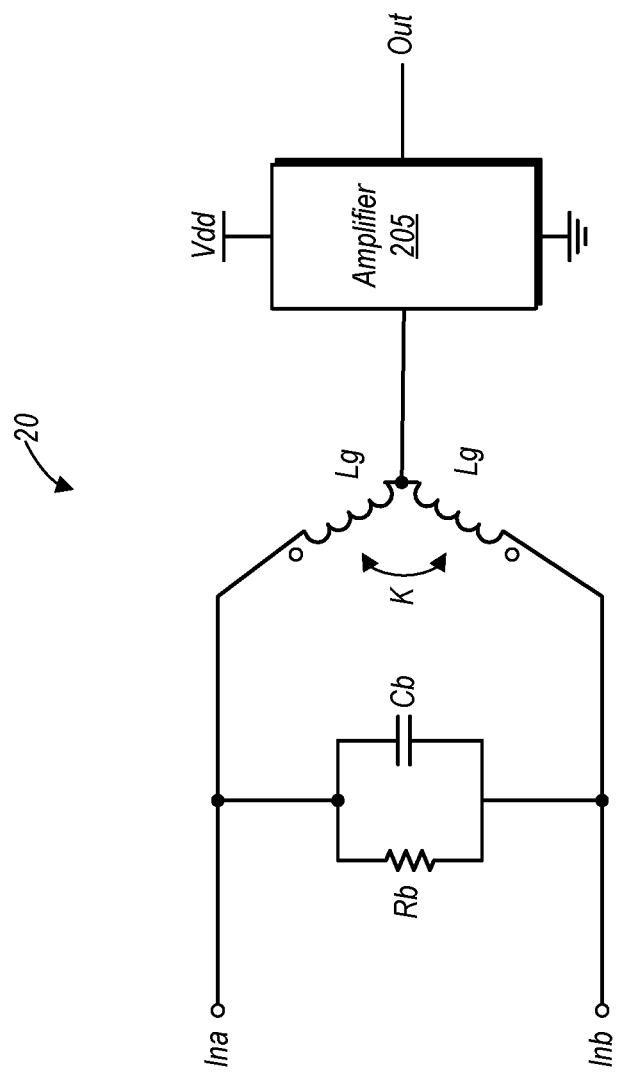
FIG. 1 is a diagram of one embodiment of a Wilkinson Combiner.

Although the embodiments disclosed herein are susceptible to various modifications and alternative forms, specific embodiments are shown by way of example in the drawings and are described herein in detail. It should be understood, however, that drawings and detailed description thereto are not intended to limit the scope of the claims to the particular forms disclosed. On the contrary, this application is intended to cover all modifications, equivalents and alternatives falling within the spirit and scope of the disclosure of the present application as defined by the appended claims.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Within this disclosure, different entities (which may variously be referred to as "units," "circuits," other components, etc.) may be described or claimed as "configured" to perform one or more tasks or operations. This formulation—[entity] configured to [perform one or more tasks]—is used herein to refer to structure (i.e., something physical, such as an electronic circuit). More specifically, this formulation is used to indicate that this structure is arranged to perform the one or more tasks during operation. A structure can be said to be "configured to" perform some task even if the structure is not currently being operated. A "credit distribution circuit configured to distribute credits to a plurality of processor cores" is intended to cover, for example, an integrated circuit that has circuitry, that performs this function during operation, even if the integrated circuit in question is not currently being used (e.g., a power supply is not connected to it). Thus, an entity described or recited as "configured to" perform some task refers to something physical, such as a device, circuit, memory storing program instructions executable to implement the task, etc. This phrase is not used herein to refer to something intangible.

The term "configured to" is not intended to mean "configurable to." An unprogrammed FPGA, for example, would not be considered to be "configured to" perform some specific function, although it may be "configurable to" perform that function after programming.

Reciting in the appended claims that a structure is "configured to" perform one or more tasks is expressly intended not to invoke 35 U.S.C. § 112(f) for that claim element. Accordingly, none of the claims in this application as filed are intended to be interpreted as having means-plus-function elements. Should Applicant wish to invoke Section 112(f) during prosecution, it will recite claim elements using the "means for" [performing a function] construct.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. As used herein, the phrase "based on" is synonymous with the phrase "based at least in part on."

As used herein, the phrase "in response to" describes one or more factors that trigger an effect. This phrase does not foreclose the possibility that additional factors may affect or otherwise trigger the effect. That is, an effect may be solely in response to those factors, or may be in response to the specified factors as well as other, unspecified factors. Consider the phrase "perform A in response to B." This phrase specifies that B is a factor that triggers the performance of A. This phrase does not foreclose that performing A may also be in response to some other factor, such as C. This phrase is also intended to cover an embodiment in which A is performed solely in response to B.

As used herein, the terms "first," "second," etc. are used as labels for nouns that they precede, and do not imply any type of ordering (e.g., spatial, temporal, logical, etc.), unless stated otherwise. For example, in a register file having eight registers, the terms "first register" and "second register" can be used to refer to any two of the eight registers, and not, for example, just logical registers 0 and 1.

When used in the claims, the term "or" is used as an inclusive or and not as an exclusive or. For example, the phrase "at least one of x, y, or z" means any one of x, y, and z, as well as any combination thereof.

In the following description, numerous specific details are set forth to provide a thorough understanding of the disclosed embodiments. One having ordinary skill in the art, however, should recognize that aspects of disclosed embodiments might be practiced without these specific details. In some instances, well-known circuits, structures, signals, computer program instruction, and techniques have not been shown in detail to avoid obscuring the disclosed embodiments.

DETAILED DESCRIPTION OF EMBODIMENTS

The present disclosure is directed to an active Wilkinson combiner. Various embodiments of a Wilkinson combiner as disclosed herein utilize a coupled inductor having three terminals and an RC isolation network. The Wilkinson combiner of the present disclosure may provide good impedance matching over a number of different signal configurations. Furthermore, good isolation may be provided between the input ports using the isolation network. Accordingly, the Wilkinson combiner of the present disclosure may not suffer the problems of insertion loss of those that are based entirely on passive components, and may have better isolation between the input ports relative to other types of active Wilkinson combiners.

Turning now to FIG. 1, a basic diagram of one embodiment of a Wilkinson combiner in accordance with the disclosure is shown. In the embodiment shown, Wilkinson combiner 20 includes two input ports, Ina and Inb. Coupled between the two ports in this embodiment is an RC network including resistor Rb and capacitor Cb, which are in parallel with one another. Both of the input ports are connected to a coupled inductor, Lg. Although schematically, inductor Lg appears as two separate inductors, in practice it is actually implemented as a single inductor having three terminals (an example of which is discussed below with reference to FIG. 4).

Coupling inductor Lg as shown here includes a first portion having a first terminal coupled to the first input port, Ina, and a second portion having a second terminal coupled to the second input port Inb. The third terminal is coupled to an input of amplifier 205. The respective signal paths for signals provided to the input ports lead to the third terminal, from which a combined signal is input into amplifier 205. Between the two portions of coupling inductor Lg is, when operating, a mutual inductance having a coupling coefficient, k.

Amplifier 205 in the embodiment shown may be one of several different configurations, some of which are discussed below. The amplifier may boost the amplitude of the combined signal and provide it on an output node, Out, to other circuitry (e.g., downconversion and/or baseband circuitry, etc.).

Figure 2:
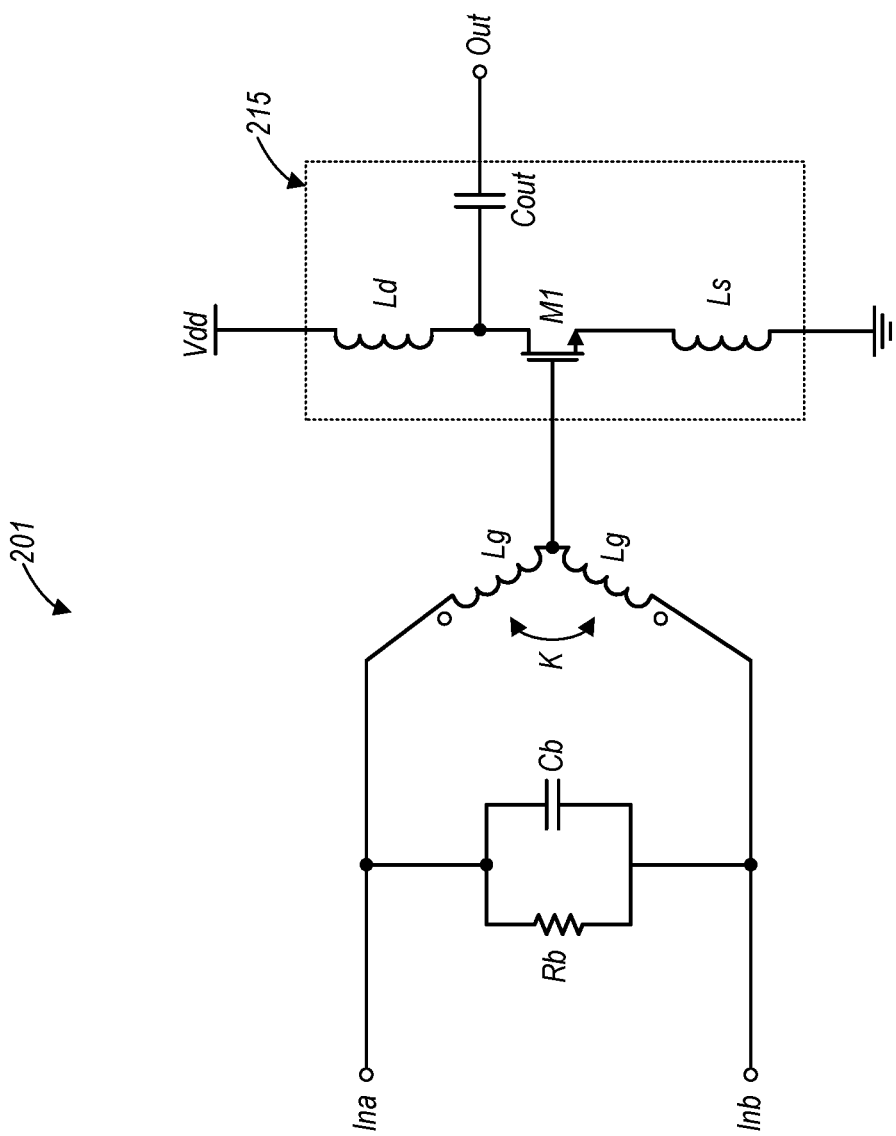
FIG. 2 is a diagram of an embodiment of a Wilkinson Combiner having a first embodiment of an amplifier.

FIG. 2 is a diagram of an embodiment of a Wilkinson combiner having a first embodiment of an amplifier. In this embodiment, Wilkinson combiner 201 includes the same front end circuitry as the embodiment of FIG. 1, namely the input ports, the RC network, and a coupled inductor.

Amplifier 215 in this particular embodiment is a source degeneration inductor amplifier circuit. The input to the amplifier is on the gate terminal of transistor M1, which is arranged in a common source configuration. Inductor Ld is coupled between the drain terminal of M1 and a voltage source Vdd. The output path from amplifier 201 passes from the drain terminal of M1, through Cout, thereby providing an AC coupled output that blocks DC components (e.g. from Vdd). The source terminal of transistor M1 is coupled to an inductor LS, which is further coupled to ground on its other terminal.

Figure 3:
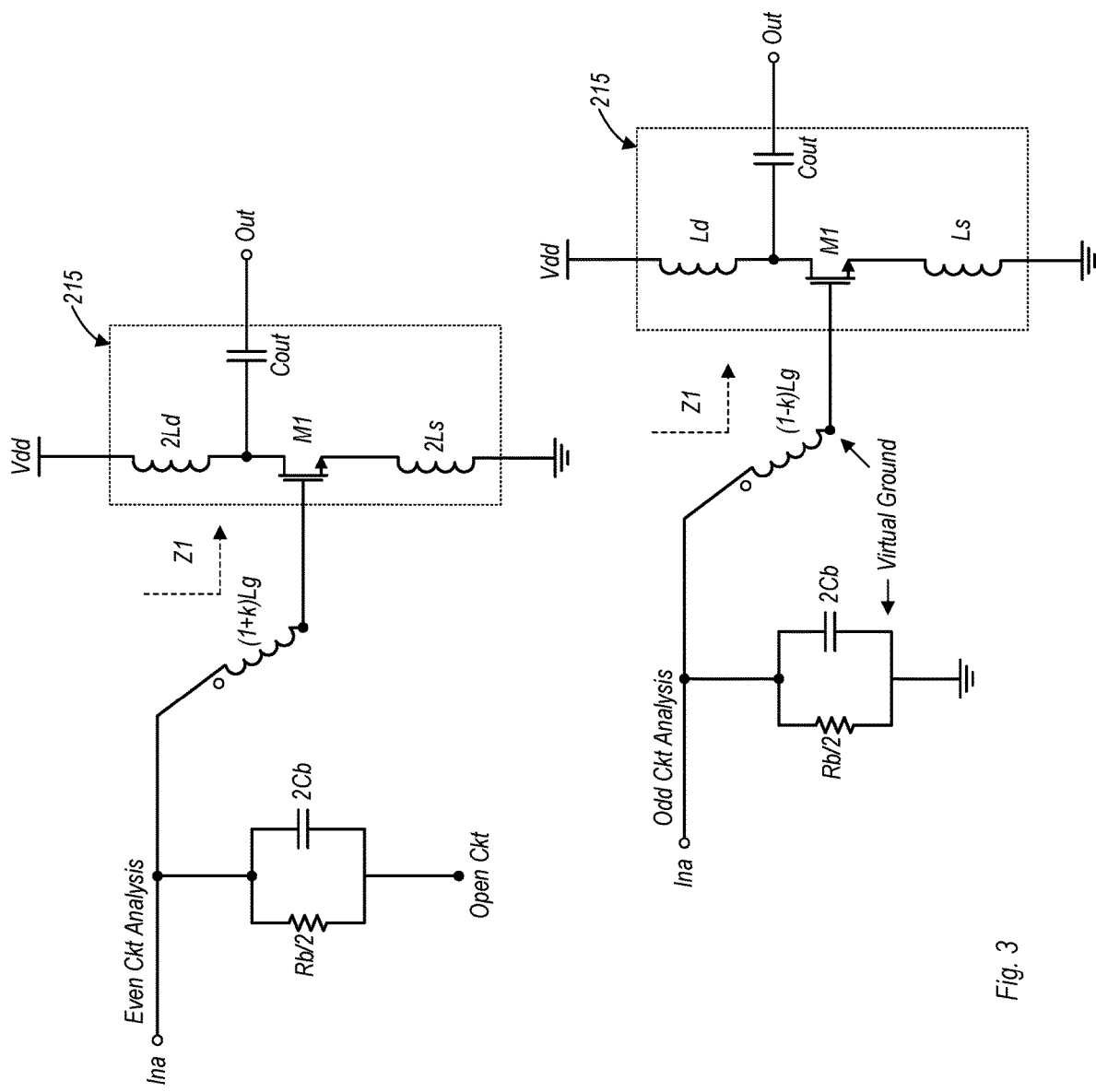
FIG. 3 is a diagram illustrating odd and even circuit analysis on the Wilkinson Combiner of FIG. 2.

FIG. 3 is a diagram illustrating odd and even circuit analysis on the Wilkinson combiner of FIG. 2. More particularly, FIG. 3 illustrates equivalent half-circuits under even analysis and under odd analysis. Even circuit analysis is based on having two in-phase signals provided to the respective input ports. Odd circuit analysis is based on having two opposite phase signals provided to the input ports.

For both the even and odd equivalent circuits, the impedance Z1 looking into the amplifier input, the gate of M1, is the same. In this particular example, the impedance Z1 is defined by the following equation:

$$Z1 = 2\left(\frac{1}{j\omega Cgs} + jwL_s + \frac{gmL_s}{Cgs}\right), \quad \text{(eq. 1)}$$

Where Cgs is the gate-source capacitance of M1, and gm is the transconductance of M1).

To achieve both input impedance matching and isolation between the inputs, in even circuit analysis, the following two equations are satisfied:

$$2\left(\frac{gmL_s}{Cgs}\right) = z_o, \text{ and} \quad \text{(eq. 2)}$$

$$2\left(\frac{1}{jwCgs} + j\omega L_s\right) + j\omega L_g(1+k) = 0, \quad \text{(eq. 3)}$$

where k is the coupling factor of the portions of the coupled inductor. In the even circuit analysis, the RC network coupled between the inputs forms a virtual open circuit with respect to Ina looking through the network to Inb (it is noted that the same applies to Inb looking through the network to Ina).

For the odd mode, the input node to the amplifier as well as one of the junctions between the capacitor and resistor in the RC network are virtual grounds. In this case, the two equations that are satisfied to achieve input impedance matching and isolation between the ports are as follows:

$$\frac{R_b}{2} = z_0, \text{ and} \quad \text{(eq. 4)}$$

$$\frac{1}{j\omega L_g(1-k)} + j2\omega C_b = 0. \quad \text{(eq. 5)}$$

By designing a Wilkinson combiner in accordance with the equations presented above, the resulting circuit can achieve the desired isolation between the input ports, as well as the desired input impedance.

Figure 4:
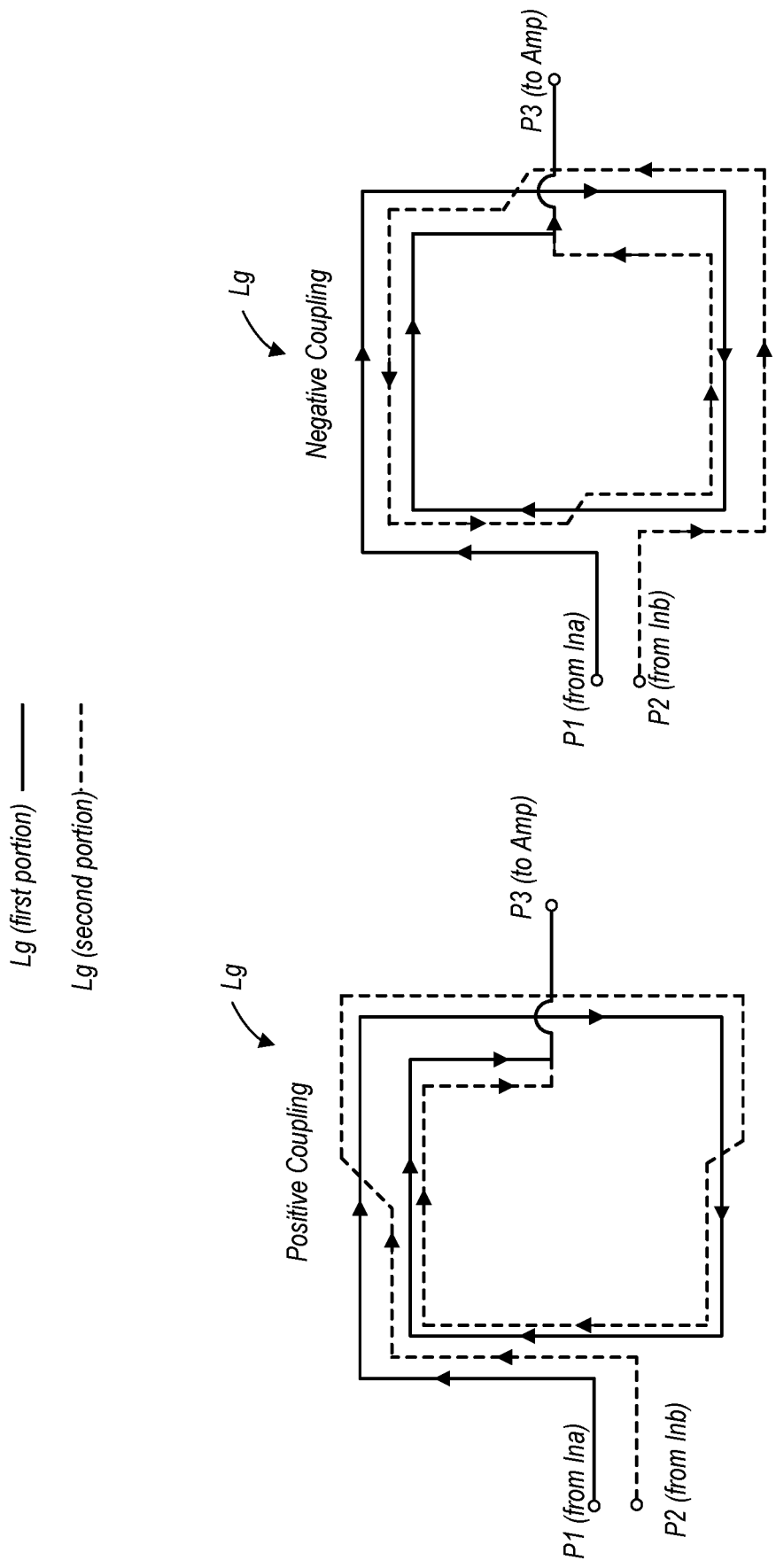
FIG. 4 is a diagram of one embodiment of a coupled inductor used in various embodiment of a Wilkinson Combiner.

FIG. 4 is a diagram of one embodiment of a coupled inductor used in various embodiment of a Wilkinson combiner according to this disclosure. It is noted that the embodiment shown here is one possible configuration for a coupled inductor that may be used in various embodiments of a Wilkinson combiner. Other configurations are possible and contemplated within the scope of this disclosure.

In the embodiment shown, coupled inductor Lg includes two separate conductors. The separate conductors, originating at P1 and P2 respectively, are eventually joined into a single conductor that terminates at P3. The first portion of inductor Lg is shown here as a solid line, while the second portion is shown as a dashed line (with the junction of these two up to P3 shown as a solid line). The conductors as shown here may be shaped in order to achieve a desired coupling coefficient k. Furthermore, as shown, the first and second conductors can be implemented in a tightly coupled way or loosely coupled way to achieve high coupling factor k or low coupling factor k, respectively. Thus, the coupling factor k may be one degree of design freedom with regard to the various embodiments of a Wilkinson combiner shown here.

Two examples of inductor Lg are shown here, with arrows illustrating the respective directions of current flow at a given instant for positive coupling and negative coupling. For a particular design, a coupling coefficient k may be chosen as positive or negative as one design factor, with this choice being based on others in some embodiments. Other design factors may include the inductance of the coupled inductor, its impedance curve, or others not explicitly directed to the coupled inductor itself but affecting the overall operation of the Wilkinson combiner.

Figure 5:
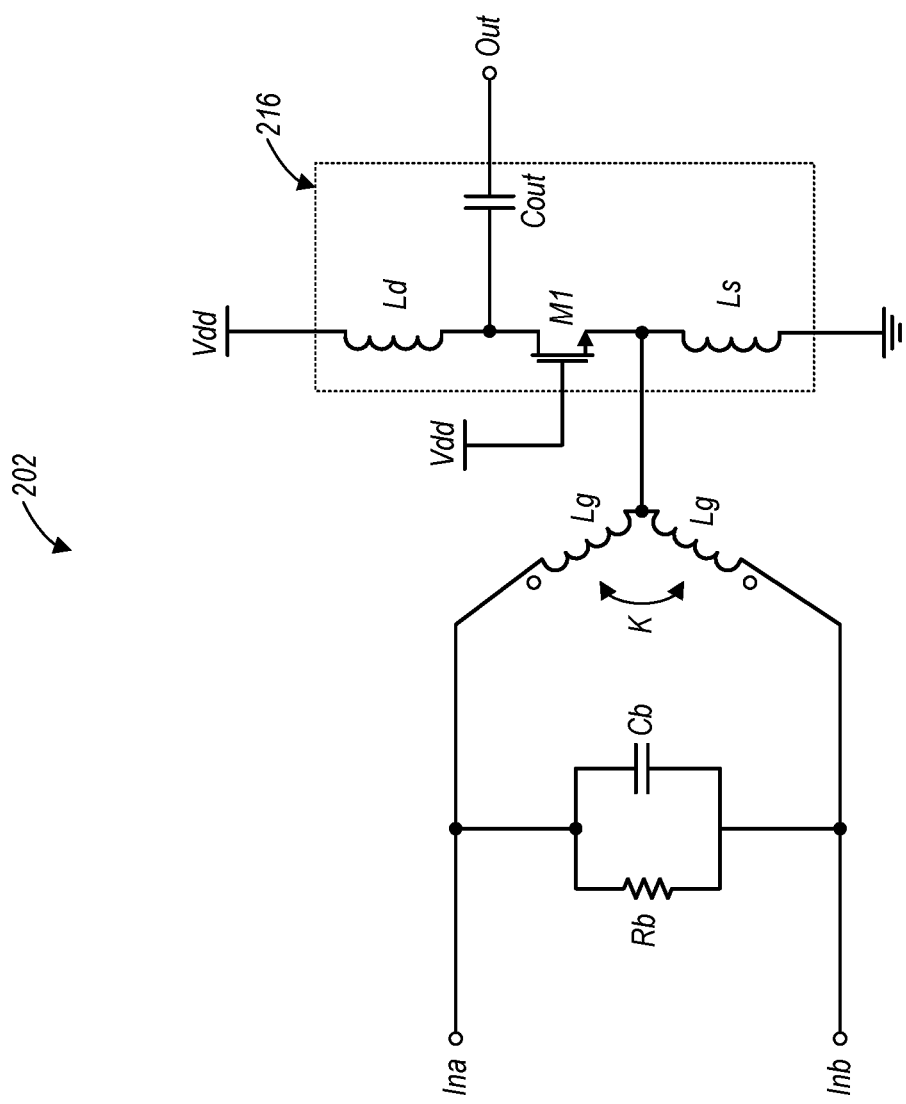
FIG. 5 is a diagram of another embodiment of a Wilkinson Combiner having a second embodiment of an amplifier.

FIG. 5 is a diagram of another embodiment of a Wilkinson Combiner having a second embodiment of an amplifier. In this embodiment, Wilkinson combiner 202 utilizes a common gate amplifier 215. As shown here, the gate terminal of transistor M1 is coupled directly to supply voltage node Vdd, while the input to the simplifier is on its source terminal. The output of the amplifier is taken from the drain terminal of M1, via AC coupling capacitor Cout. A first inductor, Ld, is coupled between the drain terminal of M1 and the supply voltage node Vdd. A second inductor, Ls, is coupled between the source terminal of M1 and the ground terminal.

This configuration may be suitable for use in, e.g., CMOS RF receivers and in applications in which the frequencies of the signals are near the limits of the transistors implemented. Furthermore, this amplifier configuration may result in a circuit having good noise performance, and may provide easy impedance matching relative to some types of amplifier configurations.

Figure 6:
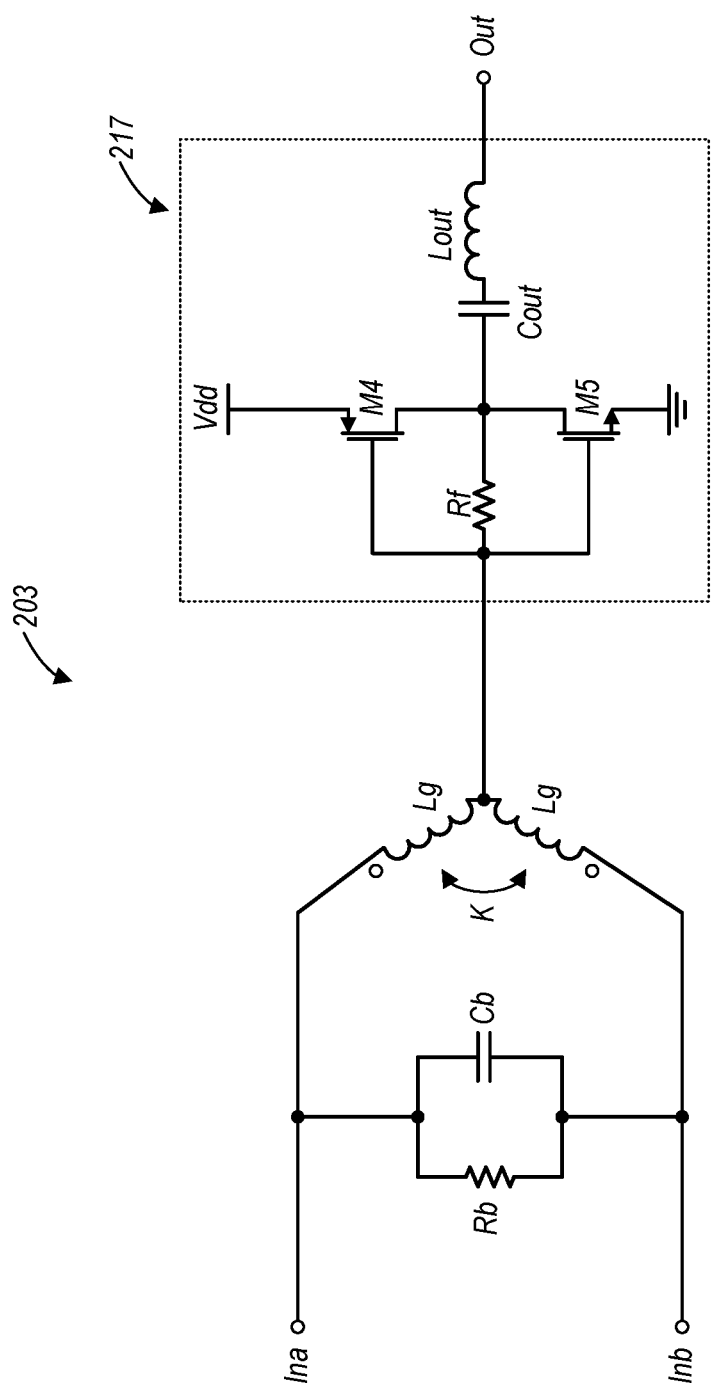
FIG. 6 is a diagram of another embodiment of a Wilkinson Combiner having a third embodiment of an amplifier.

FIG. 6 is a diagram of another embodiment of a Wilkinson combiner having a third embodiment of an amplifier. In this embodiment, Wilkinson combiner 203 utilized a complementary amplifier 217, which may alternately be referred to as a push-pull amplifier. In the illustrated complementary amplifier 217 includes a PMOS transistor M4 and an NMOS transistor M5. Transistors M4 and M5 are coupled to one another via their respective drain terminals. A source terminal of M4 is coupled to a supply voltage node Vdd. The source terminal of M5 is coupled to a ground node. A feedback resistor Rf is coupled between the drain and gate terminals of each of transistors M4 and M5. Additionally, the input to complementary amplifier 217 is coupled to the gate terminals of M4 and M5 as well as to the feedback resistor Rf. Both an AC coupling capacitor Cout and an inductor Lout are coupled in series between the drain terminals of M4 and M5 and the output node, Out.

It is noted that while the various embodiments of a Wilkinson combiner discussed above utilize single-ended outputs, other embodiments having differential outputs are also possible and contemplated. Furthermore, embodiments in which the coupled inductor is replaced by, e.g., a coupled transmission line or a transformer are also possible and contemplated. Generally speaking, the various embodiments of a Wilkinson combiner as disclosed herein include an RC network coupled between the input nodes (for isolation, as discussed above) and a coupled component that provides some sort of inductive coupling and that is connected to the amplifier input.

The complementary amplifier embodiment of a Wilkinson combiner as shown in FIG. 6 may be used in applications in which power efficiency is prioritized. Utilizing a push-pull amplifier, Wilkinson combiner may provide a signal with higher output power for a given supply voltage.

Figure 7:
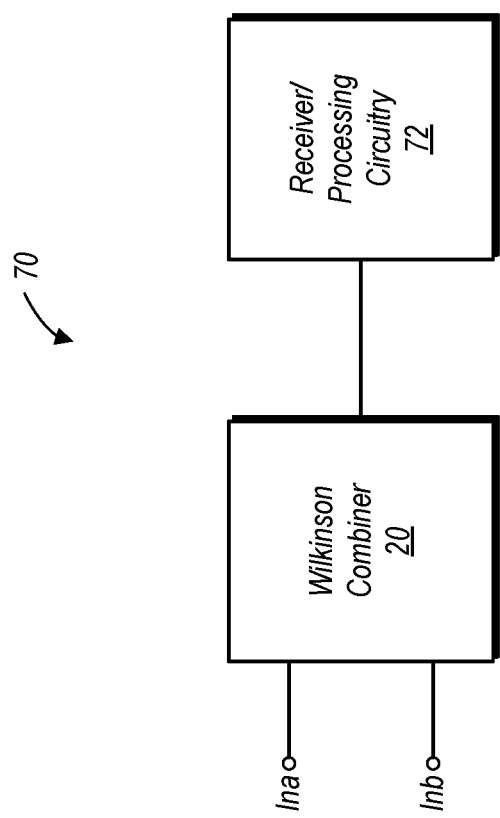
FIG. 7 is a diagram of one embodiment of a receiver utilizing a Wilkinson Combiner.

FIG. 7 is a diagram of one embodiment of a receiver utilizing a Wilkinson combiner. In the embodiment shown, receiver 20 includes a Wilkinson combiner 20 having two input ports (Ina and Inb) and receiver/processing circuitry 72. The input ports may be coupled to, e.g., antennas, high frequency transmission lines, or any other suitable signal source. The receiver/processing circuitry may include, e.g, baseband circuitry, downconversion circuit, and circuits for converting extracted information into a digital format if not already done so. Although not explicitly shown, the receiver/processing circuitry may output extracted data to other circuits for further processing, storage, display, or other function.

Figure 8:
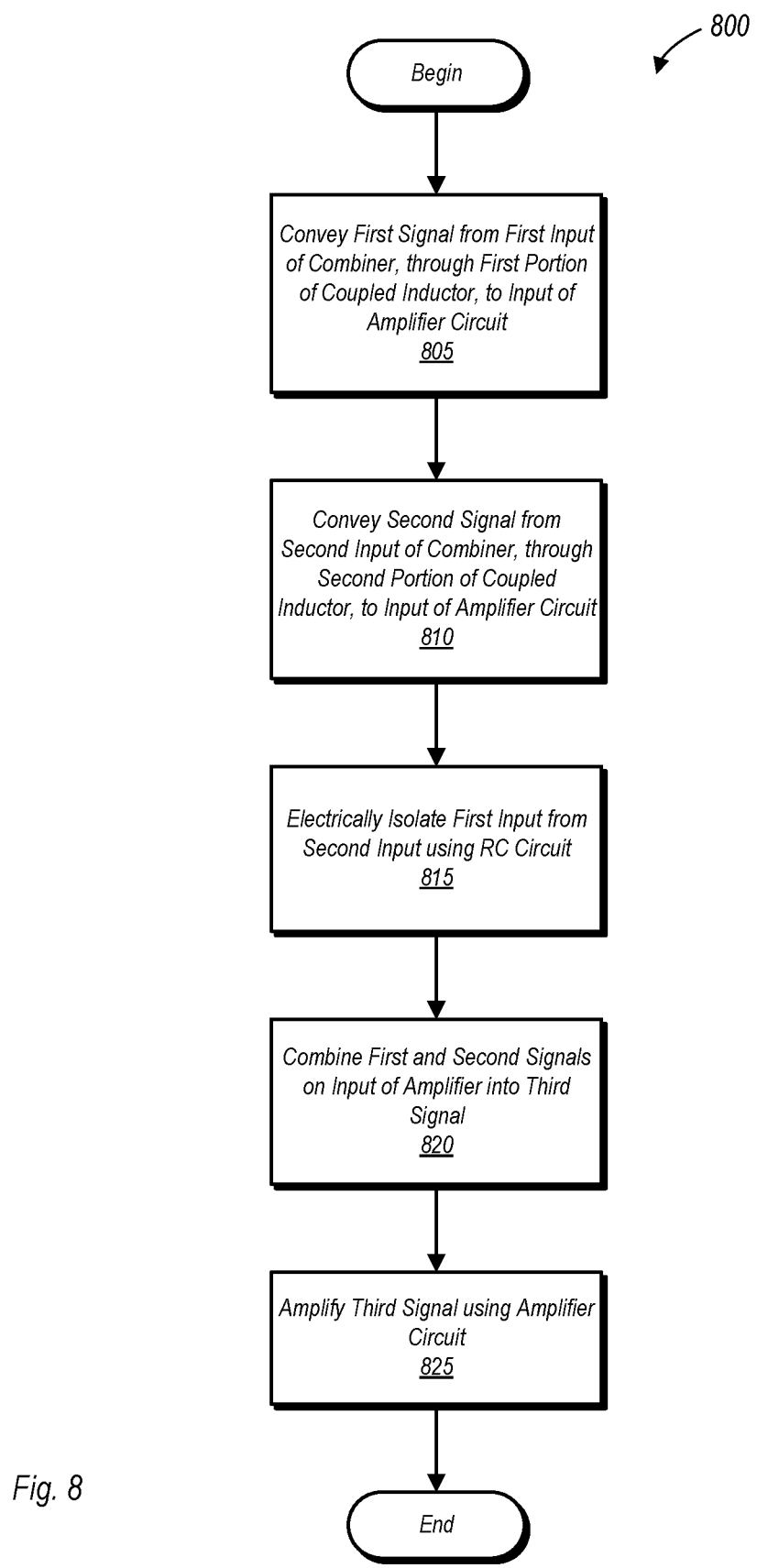
FIG. 8 is a flow diagram of one embodiment of a method for operating a Wilkinson Combiner.

FIG. 8 is a flow diagram of one embodiment of a method for operating a Wilkinson combiner. Method 800 may be performed using any embodiment of a Wilkinson combiner as disclosed herein, as well as with other embodiments not explicitly discussed but nevertheless fall within the scope of this disclosure.

Method 800 begins with the conveying of a first signal from a first input port of a combiner, through a first portion of a coupled inductor (or other inductively coupled component), to an input of an amplifier circuit (block 805). The method further includes conveying a second signal from a second input port of the combiner, through a second portion of the coupled inductor/component, to the input of the amplifier circuit (block 810). Additionally, the method include electrically isolating the first input from the second input using an RC circuit (block 815). The first and second signals are combined on the node of the amplifier input to into a third signal (block 820). The third signal is then amplified by the amplifier circuit (block 825) and subsequently output to another destination.

Turning next to FIG. 9, a block diagram of one embodiment of a system 150 is shown. In the illustrated embodiment, the system 150 includes at least one instance of an integrated circuit 10 coupled to external memory 158. The integrated circuit 10 may include a memory controller that is coupled to the external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

In various embodiment, the system shown in FIG. 9 may include receiver circuitry having a Wilkinson combiner as discussed herein. The Wilkinson combiner may be implemented on integrated circuit 10, or on integrated circuits that are part of peripherals 154. Some embodiments may implement more than one Wilkinson combiner, which can be implemented on integrated circuit 10, in peripherals 154, or both.

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A circuit comprising:
a first input port;
a second input port;
a resistive-capacitive (RC) network coupled between the first and second input ports;
an amplifier circuit having an amplifier input node;
a coupled inductor having a first portion including a first terminal coupled to the first input port, a second portion including second terminal coupled to the second input port, and a third terminal coupled to the amplifier input node and further coupled to each of the first and second portions.

2. The circuit as recited in claim 1, wherein, during operation of the circuit, the first and second portions of the coupled inductor have a mutual inductance with one another.

3. The circuit as recited in claim 1, wherein the RC network comprises a resistor coupled between the first and second input ports and a capacitor coupled in parallel with the resistor.

4. The circuit as recited in claim 1, wherein the amplifier circuit is a source degeneration inductor amplifier circuit.

5. The circuit as recited in claim 1, wherein the amplifier circuit is a source degeneration inductor amplifier circuit including:
a transistor having a gate terminal coupled to the third terminal of the coupled inductor;
a first inductor coupled between a drain terminal of the transistor and a power supply node; and
a second inductor coupled between a source terminal of the transistor and a ground node.

6. The circuit as recited in claim 1, wherein the amplifier circuit is a common gate amplifier circuit.

7. The circuit as recited in claim 6, wherein the common gate amplifier circuit includes:
a transistor having a gate terminal coupled to a power supply node;
a first inductor coupled between a drain terminal of the transistor and the power supply node; and
a second inductor coupled between a source terminal of the transistor and a ground node.

8. The circuit as recited in claim 1, wherein the amplifier circuit is a complementary amplifier.

9. The circuit as recited in claim 8, wherein the complementary amplifier includes:
a first transistor having a respective gate terminal coupled to the third terminal of the coupled inductor and a source terminal coupled to a power supply node;
a second transistor having a respective gate terminal coupled to the third terminal of the coupled inductor and a source terminal coupled to a ground node; and
a feedback resistor coupled between gate and drain terminals of each of the first and second transistors.

10. A method comprising:
conveying a first signal from a first input of a combiner circuit, through a first portion of a coupled inductor, to an input of an amplifier circuit;
conveying a second signal from a second input of the combiner circuit, through a second portion of the coupled inductor;
electrically isolating the first input from the second input using a resistive-capacitive (RC) network
combining the first and second signals on the input of the amplifier circuit to produce a third signal; and
amplifying the third signal using the amplifier circuit.

11. The method as recited in claim 10, wherein combining the first and second signals comprises conveying the first and second signals to a source terminal of a transistor arranged in a common gate amplifier configuration.

12. The method as recited in claim 10, wherein combining the first and second signals comprises conveying the first and second signals to a gate terminal of a transistor implemented in a source degeneration inductor amplifier configuration.

13. The method as recited in claim 10, wherein combining the first and second signals comprises conveying the first and second signals to a gate terminal of a transistor implemented in a complementary amplifier having resistive feedback.

14. The method as recited in claim 10, further comprising the first and second portions of the coupled inductor mutually inducing respective voltages into one another.

15. A receiver circuit comprising:
   a first input coupled to receive a first radio frequency signal;
   a second input coupled to receive a second radio signal;
   a resistive-capacitive (RC) circuit coupled between the first and second inputs, wherein the RC circuit is configured to electrically isolate the first and second inputs from one another;
   an amplifier circuit; and
   a coupled inductor having a first terminal coupled to the first input, a second terminal coupled to the second input, and a third terminal coupled to an input of the amplifier circuit, wherein the coupled inductor is configured to provide, from the third terminal, a third radio frequency signal produced by combining the first and second radio signals.

16. The receiver circuit as recited in claim 15, wherein the amplifier circuit is a source degeneration inductor amplifier circuit including:
   a transistor having a gate terminal coupled to the third terminal of the coupled inductor;
   a first inductor coupled between a drain terminal of the transistor and a power supply node; and
   a second inductor coupled between a source terminal of the transistor and a ground node.

17. The receiver circuit as recited in claim 15, wherein the amplifier circuit is a common gate amplifier circuit
   a transistor having a gate terminal coupled to a power supply node;
   a first inductor coupled between a drain terminal of the transistor and the power supply node; and
   a second inductor coupled between a source terminal of the transistor and a ground node.

18. The receiver circuit as recited in claim 15, wherein the receiver circuit is a complementary amplifier
   a first transistor having a respective gate terminal coupled to the third terminal of the coupled inductor and a source terminal coupled to a power supply node;
   a second transistor having a respective gate terminal coupled to the third terminal of the coupled inductor and a source terminal coupled to a ground node; and
   a feedback resistor coupled between gate and drain terminals of each of the first and second transistors.

19. The receiver circuit as recited in claim 15, wherein the RC circuit comprises a resistor and a capacitor coupled in parallel between the first input and the second input.

20. The receiver circuit as recited in claim 15, wherein, during operation of the circuit, first and second portions of the coupled inductor have a mutual inductance with one another.

* * * * *